United States Patent
Thallner

(10) Patent No.: US 7,547,611 B2
(45) Date of Patent: Jun. 16, 2009

(54) PROCESS AND DEVICE FOR BONDING WAFERS

(76) Inventor: Erich Thallner, Bubing 71, 4782 St. Florian (AT)

( * ) Notice: Subject to any disclaimer, the term of this patent is extended or adjusted under 35 U.S.C. 154(b) by 38 days.

(21) Appl. No.: 11/953,553

(22) Filed: Dec. 10, 2007

(65) Prior Publication Data

US 2008/0153258 A1    Jun. 26, 2008

(30) Foreign Application Priority Data

Dec. 12, 2006    (DE)    ........................ 10 2006 058 493

(51) Int. Cl.
*H01L 21/603* (2006.01)
(52) U.S. Cl. ..................................... 438/455; 228/123.1
(58) Field of Classification Search ................. 438/455; 228/49.5, 120, 123.1
See application file for complete search history.

(56) References Cited

U.S. PATENT DOCUMENTS

2007/0296035 A1* 12/2007 George et al. ............... 257/347

FOREIGN PATENT DOCUMENTS

| | | |
|---|---|---|
| AT | 405700 B | 10/1999 |
| JP | 2005-047059 * | 2/2005 |
| WO | WO2004/026531 | 4/2004 |

* cited by examiner

*Primary Examiner*—W. David Coleman
(74) *Attorney, Agent, or Firm*—Kusner & Jaffe

(57) ABSTRACT

The invention relates to a process and a device for bonding at least two substrates (1, 2), in particular semiconductor substrates or wafers, having the following features: a) a lower pressure plate (5) for holding the substrates (1, 2) and transferring pressure and, in particular, heat to the substrates (1, 2), b) an upper pressure plate (6) located opposite the lower pressure plate (5) for transferring pressure and, in particular, heat to the substrates (1, 2), c) heating means (7, 8) for heating up the substrates (1, 2), in particular to temperatures above 250° C., and d) pressure charging means, in particular an actuator (9), for charging the lower (5) and/or upper pressure plate (6) with a pressing force F, in particular higher than 500 N, preferably higher than 1,000 N. According to the invention, the upper pressure plate (6) and/or the lower pressure plate (5) are substantially free from the chemical elements Ti and Mo at least on one substrate contact surface (5o, 6o) facing the substrates.

10 Claims, 1 Drawing Sheet

PROCESS AND DEVICE FOR BONDING WAFERS

FIELD OF THE INVENTION

The invention relates to a process and a device according to the preambles of claims 1 and 8.

BACKGROUND OF THE INVENTION

In the bonding of silicon wafers or semiconductor substrates (in the following: substrates), two substrates conventionally constructed as flat, circular discs—depending on the bonding process—are bonded to one another with a bonding layer, such as, for example, with adhesive (BCB, metal, solder) or without a bonding layer (SOI bonding or SDB bonding or anodic bonding) before further working steps.

Because of the pressure required and the heating up and cooling down operations required, hard holding or pressure plates made of metal or alloyed with metal have hitherto been used to bond the substrates to one another.

In this context, the substrates are loaded on to a lower holding plate in a process chamber. After the process chamber has been closed —depending on the bonding process—the process chamber is evacuated, if appropriate, and refilled with nitrogen, and then runs through a given combined pressure and temperature programme over a given dwell time of the wafers.

The chamber is then cooled to the unloading temperature (typically between 20 and 300° C.) and the upper pressure plate is raised, so that the bonded substrates can be removed.

In this process, the upper pressure plate, via which heating is also conventionally carried out, and the lower holding plate, which can likewise contain heating elements, are kept in contact with the substrates. Application of a contact force in combination with changes in temperature (heating up and cooling down) causes impairments and contamination of the substrates. Thus, for example, scratches are caused on the substrate reverse side (side facing away from the other particular substrate) due to different thermal expansion of the substrates compared with the contact surfaces of the pressure plate or holding plate.

Furthermore, particles can be transferred from the pressure plate or holding plate to the substrates.

The substrates are moreover contaminated by metal ions contained in the holding plate and/or pressure plate, since the intensive contact can effect atomic transfer of metal ions to the substrate.

In particular during curing of the optional bonding layer between the wafers under an applied pressure, stresses may be caused in the bonding layer, which can lead to distortions of the structures on the substrate and/or substrates in the μm range.

Because of the scratches and particles, an expensive cleaning (over-etching) following the bonding operation is often necessary, in order to be able to use the substrate further in the process line (in a clean room).

Metal ions can diffuse into the semiconductor crystal during subsequent oven processes and adversely influence properties thereof as a semiconductor.

SUMMARY OF THE INVENTION

The invention is therefore based on the object of proposing an extremely gently operating device and a corresponding process for wafers in which scratches and contamination are as far as possible avoided.

This object is achieved with the features of claim 1 in terms of the device and with the features of claim 8 in terms of the process.

Advantageous further developments of the invention are described in the sub-claims.

The basic idea of the present invention is to avoid the disadvantages listed above by constructing the pressure contact surface to the semiconductor substrate or wafer from a softer but heat-resistant material or a material having the same thermal expansion coefficient as the substrates or one of the substrates, in particular wafer or semiconductor substrate.

It has emerged that in particular the hard metal alloys of the chemical elements Ti (titanium) or Mo (molybdenum) are responsible for the damage described above, so that such damage can advantageously be avoided with a material which is substantially free from titanium and molybdenum.

Because of the reverse thinning steps which often follow the bonding, it is sometimes sufficient to protect only one side of the two wafers, since the other, reverse-thinning side is in any case freed from the scratches or contamination during reverse thinning.

Possible pressure charging means are, preferably, actuators, but also membrane constructions with a pneumatic build-up of pressure behind the upper and/or lower pressure plate.

Even better results are achieved if the upper pressure plate and/or the lower pressure plate is substantially free from the chemical elements Ca (calcium), Cr (chromium), Co (cobalt), Cu (copper), Fe (iron), K (potassium), Mn (manganese), Na (sodium), Ni (nickel), Al (aluminium), V (vanadium) and Zn (zinc) at least on the substrate contact surface.

A further improvement is achieved if the substrate contact surface of the upper pressure plate and/or the substrate contact surface of the lower pressure plate is made, per $cm^2$, of a material having in each case fewer than $50 \times 10^{10}$, preferably in each case fewer than $5 \times 10^{10}$ atoms of the chemical elements Ca, Cr, Co, Cu, Fe, K, Mn, Mo, Na, Ni and Ti and in each case fewer than $20 \times 10^{11}$, preferably in each case fewer than $1 \times 10^{11}$ atoms of the chemical elements Al, V and Zn.

Particularly advantageously, at least one of the substrate contact surfaces is at least substantially, preferably completely free from metal ions.

When the upper and/or the lower pressure plate are formed from the same base material as the substrate in contact with the particular substrate contact surface, the corresponding pressure plate and the substrate in contact with this expand uniformly when the temperature changes, as a result of which scratches and deposits can be avoided.

The upper and/or the lower pressure plate can advantageously be formed from plastic, in particular a polymer, preferably PTFE (polytetrafluoroethylene) and/or PEEK (polyether ether ketone) and/or PVA (polyvinyl alcohol) or PE (polyethylene), or an elastomer, preferably Viton (fluoroelastomer) and/or Kalrez (perfluorinated rubber). Because of the structure and softness, scratches and material deposits as well as contamination from appropriately constructed pressure plates on the substrates are avoided.

If at least one pressure plate is constructed from plastic, it is advantageous to carry out the charging of the substrates with heat in the device according to the invention at a temperature above 100° C., in particular between 250 and 300° C., preferably at a temperature of between 275 and 285° C., with simultaneous charging with pressure, in particular with a pressure of from 500 N to 80,000 N, and only then to carry out a higher charging with heat of above 300° C., in particular without charging with pressure, in a further device in order to avoid damage to the plastic on the pressure plate in the device according to the invention. The dwell time in the device according to the invention can thus be reduced, and because of the exclusive charging with heat in the further device, contamination and scratching are avoided. The course of the process is accordingly divided over two devices, which leads to a further optimization of the process.

In the further device for complete curing of the prebonded substrates without application of a contact force up to the particular process temperature, external ovens known in the semiconductor industry can be used.

The substrates can advantageously be brought from the process chamber into the external oven at the bonding temperature, in order to be finally cured there, as a result of which the stress introduced into the bonding layer can be broken down during final curing.

If the upper pressure plate is constructed from the same base material as the substrates, contact with metal is advantageously avoided and, due to the uniform thermal expansion of the preferably identical substrates, scratches are practically ruled out. Transfers of material are harmless because of the use of the same material.

In this case, the upper pressure plate can also be changed for each bonding operation and cleaned with the available means of semiconductor production for re-use.

Further advantages and expedient embodiments of the invention are reproduced in the further claims, the FIGURE, the description and the drawings.

DETAILED DESCRIPTION OF PREFERRED EMBODIMENT

Figure 1:
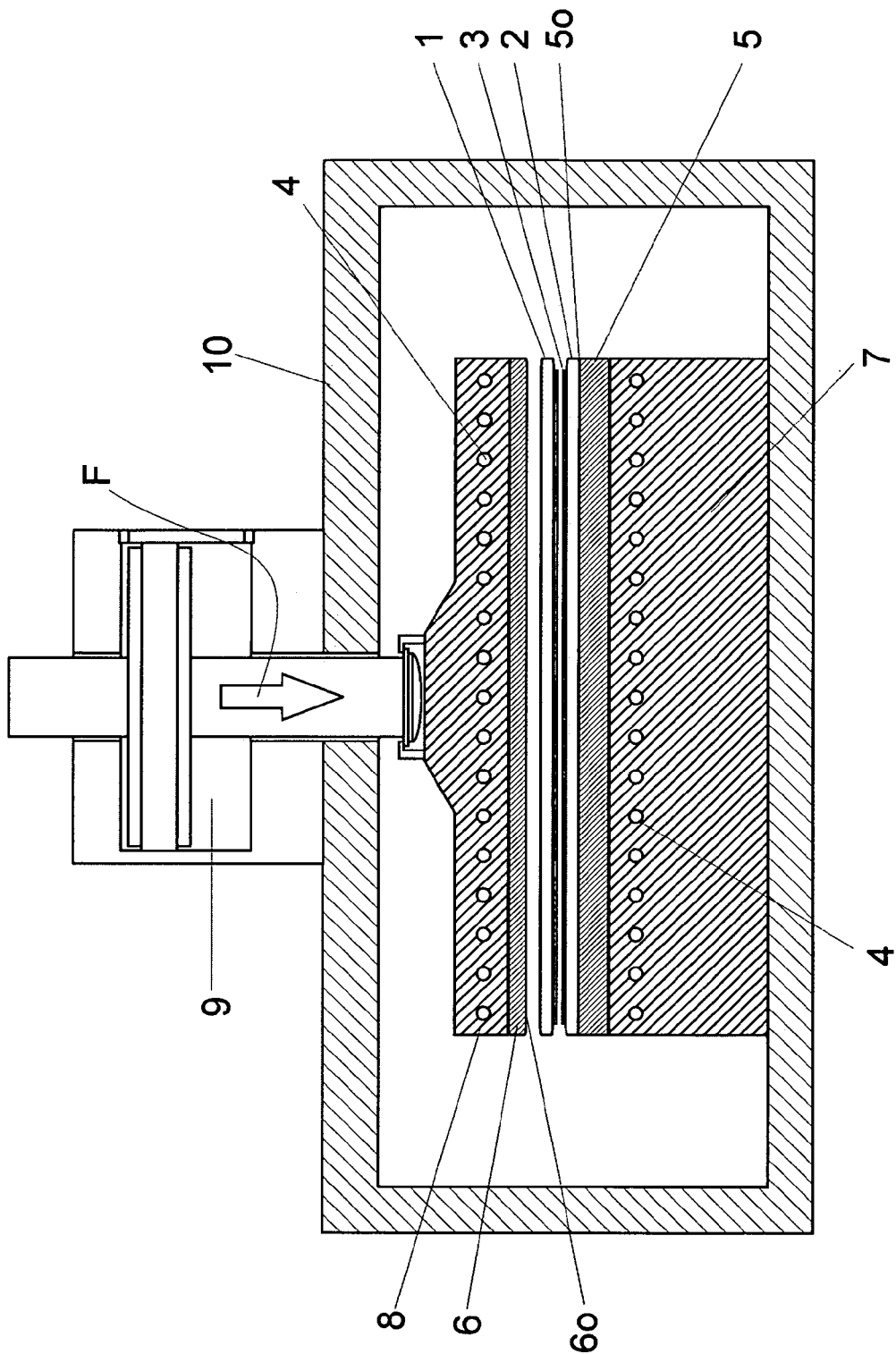
FIG. 1 shows a side view in section of the device according to the invention.

The single FIGURE shows a process chamber 10 with an opening, not shown, for loading and unloading substrates 1 and 2 and further connections, not shown, required for the process, on the upper side of which is located an actuator 9 for charging the substrates 1 and 2 with a pressing force F.

The pressing force F is transferred via an upper heating means 8 with heating coils 4 and an upper pressure plate 6 to the substrate lying on top.

The corresponding counter-force is transferred via the heating means 7 located on the base of the process chamber 10 and the lower pressure plate 5 lying on the heating means 7 to the substrate 2 held on the lower pressure plate 5. The substrates 1, 2 are bonded here by a (an optional) bonding layer 3. The lower heating means 7 has heating coils 4' for heating the lower substrate 2.

If the upper pressure plate 6 is constructed from plastic, the substrates are heated in the process chamber 10 to a maximum temperature below 300° C., after the substrates 1 and 2 have been laid on the lower pressure plate 5 via robot arms, not shown, and the upper pressure plate 6 contacts/charges the upper substrate 1 with an initially low pressing force F of between 10 N and 1,000 N. At this temperature, in most bonding processes precuring of the bonding layer 3 takes place, the dwell time depending on the particular bonding process and being between one minute and 60 minutes.

The substrates 1, 2 prebonded in this way are subsequently unloaded and completely cured at the final process temperature, which is above 300° C., in an external oven without application of a contact force and therefore without contact with metal ions. Such "clean ovens" are widely used in the semiconductor industry.

The wafers are transferred from the process chamber into the external oven at the prebonding temperature, intermediate cooling down to room temperature also being possible.

If the reverse sides of the two substrates 1, 2 are to be protected, the lower pressure plate 5 can also be constructed from plastic.

In a further embodiment of the invention, a further substrate like the substrates 1, 2 is loaded into the process chamber 10 as the upper pressure plate 6 together with substrates 1, 2, it also being possible to insert a further substrate of the same base material as the substrates 1, 2 instead of the lower pressure plate 5, in order also to protect the reverse side of the substrate 2.

This embodiment has the advantage that the substrates 1, 2 can be completely cured in the process chamber, since the upper and/or lower pressure plate 5, 6 withstand the required temperatures and pressures without destruction and, due to the uniform expansion with respect to substrates 1,2, scratches and contamination are avoided.

A course of the process could accordingly appear as follows:

Loading of the two substrates 1, 2, the bonding layer 3 fixing the substrates 1, 2 to one another and a further substrate being loaded as the upper pressure plate 6 over the substrate 1.

Closing of the process chamber 10.

Evacuation of the process chamber 10 via a vacuum line, not shown.

Refilling of the process chamber 10 via a nitrogen line (not shown).

Lowering of the heating means 8 on to the upper pressure plate 6 with a force of between 10 N and 1,000 N.

Heating up to the bonding temperature, for example 350° C.

Pressing on the upper heating means 8 by the actuator 9 with a bonding force of between 1,000 N and 80,000 N.

Holding of the temperatures and the pressure during a dwell time of from one minute to 60 minutes.

Cooling down to the unloading temperature of between 20° C. and 300° C.

Raising of the upper heating means 8 by the actuator 9.

Unloading of the bonded substrates 1 and 2.

The heating means 7, 8 can also be constructed as a combined heating and cooling means to render possible faster cooling down to the unloading temperature.

The invention claimed is:

1. Process for bonding at least two substrates (1, 2) with a device having a lower pressure plate (5) for holding the substrates (1, 2) and transferring pressure and heat to the substrates (1, 2), an upper pressure plate (6) located opposite the lower pressure plate (5) for transferring pressure and heat to the substrates (1, 2), heating means (7, 8) for heating up the substrates (1, 2) to temperatures above 100° C., and pressure charging means for charging the lower (5) and/or upper pressure plate (6) with a pressing force F higher than 500 N, the upper pressure plate (6) and/or the lower pressure plate (5) being substantially free from the chemical elements Ti and Mo at least on one substrate contact surface (5o, 6o) facing the substrates, said process comprising the following process steps:

a) introduction of the substrates (1, 2) between an upper pressure plate (6) and a lower pressure plate (5), b) charging of the substrates (1, 2) with pressure by means of a pressure charging means, in particular an actuator (9), with a pressing force F, in particular higher than 500 N, preferably higher than 1,000 N, and c) charging of the substrates (1, 2) with heat by means of a heating means (7, 8), in particular to temperatures above 100° C., preferably above 250° C.

2. Process according to claim 1, characterized in that the charging of the substrates (1, 2) with heat takes place in the device according to claim 7 at a temperature of between 250° C. and 300° C., in particular at a temperature of between 275° C. and 285° C., with simultaneous charging with pressure, in particular with a pressure of from 500 N to 80,000 N, and a charging with heat to above 300° C., in particular without charging with pressure, subsequently takes place in a further device.

3. Process according to claim 2, in which the charging with pressure is carried out with a dwell time of between 1 minute and 60 minutes, in particular 10 to 30 minutes.

4. Device for bonding at least two substrates (1, 2), in particular semiconductor substrates or wafers, having the following features:

a) a lower pressure plate (5) for holding the substrates (1, 2) and transferring pressure and, in particular, heat to the substrates (1, 2), b) an upper pressure plate (6) located opposite the lower pressure plate (5) for transferring pressure and, in particular, heat to the substrates (1, 2), c) heating means (7, 8) for heating up the substrates (1, 2), in particular to temperatures above 100° C., preferably above 250° C., and d) pressure charging means, in particular an actuator (9), for charging the lower (5) and/or upper pressure plate (6) with a pressing force F, in particular higher than 500 N, preferably higher than 1,000 N characterized in that the upper pressure plate (6) and/or the lower pressure plate (5) are substantially free from the chemical elements Ti and Mo at least on one substrate contact surface (5o, 6o) facing the substrates.

5. Device according to claim 4, characterized in that the upper pressure plate (6) and/or the lower pressure plate (5) are substantially free from the chemical elements Ca, Cr, Co, Cu, Fe, K, Mn, Na, Ni, Al, V and Zn at least on the substrate contact surface (5o, 6o).

6. Device according to claim 4, characterized in that the substrate contact surface (6o) and/or the substrate contact surface (5o) is made, per cm$^2$, of a material having in each case fewer than $50 \times 10^{10}$, preferably in each case fewer than $5 \times 10^{10}$ atoms of the chemical elements Ca, Cr, Co, Cu, Fe, K, Mn, Mo, Na, Ni and Ti and in each case fewer than $20 \times 10^{11}$, preferably in each case fewer than $1 \times 10^{11}$ atoms of the chemical elements Al, V and Zn.

7. Device according to claim 4, characterized in that the substrate contact surface (6o) and/or the substrate contact surface (5o) is at least substantially, preferably completely free from metal ions.

8. Device according to claim 4, characterized in that at least the substrate contact surface (5o, 6o) of the upper pressure plate (6) and/or of the lower pressure plate (5) has a lower strength than or a substantially identical thermal expansion coefficient to the substrate (1, 2) in contact with the particular substrate contact surface (5o, 6o).

9. Device according to claim 4, characterized in that the upper (6) and/or the lower pressure plate (5) is formed from the same base material as the substrate (1, 2) in contact with the particular substrate contact surface (5o, 6o).

10. Device according to one of claims 4 to 8, characterized in that the upper (6) and/or the lower pressure plate (5) is formed from plastic, in particular a polymer, preferably PTFE and/or PEEK and/or PVA and/or PE, or an elastomer, preferably Viton and/or Kalrez.

* * * * *